United States Patent [19]
Jung et al.

[11] Patent Number: 6,143,463
[45] Date of Patent: Nov. 7, 2000

[54] METHOD AND PHOTORESIST USING A PHOTORESIST COPOLYMER

[75] Inventors: Jae Chang Jung; Cheol Kyu Bok; Ki Ho Baik, all of Ichon, Rep. of Korea

[73] Assignee: Hyundai Electronics Industries Co. Ltd., Rep. of Korea

[21] Appl. No.: 08/992,033

[22] Filed: Dec. 17, 1997

[30] Foreign Application Priority Data

Dec. 20, 1996 [KR]  Rep. of Korea ..................... 96-068906

[51] Int. Cl.⁷ .................................................. G03F 7/004
[52] U.S. Cl. ........................ 430/270.1; 430/905; 526/284
[58] Field of Search ................................ 430/270.1, 905; 526/284

[56] References Cited

U.S. PATENT DOCUMENTS

| | | |
|---|---|---|
| 4,011,386 | 3/1977 | Matsumoto et al. . |
| 4,106,943 | 8/1978 | Ikeda et al. . |
| 4,491,628 | 1/1985 | Ito et al. ................................. 430/176 |
| 4,883,740 | 11/1989 | Schwalm et al. ........................ 430/270 |
| 5,087,677 | 2/1992 | Brekner et al. . |
| 5,212,043 | 5/1993 | Yamamoto et al. . |
| 5,252,427 | 10/1993 | Bauer et al. ............................. 430/270 |
| 5,278,214 | 1/1994 | Moriya et al. . |

FOREIGN PATENT DOCUMENTS

| | | |
|---|---|---|
| 128164 | 2/1977 | European Pat. Off. . |
| 794458 | 9/1997 | European Pat. Off. . |
| 0836119A1 | 11/1997 | European Pat. Off. . |
| 1329997 | 9/1970 | United Kingdom . |
| WO 96/37526 | 11/1996 | WIPO . |
| WO 97/33198 | 9/1997 | WIPO . |

OTHER PUBLICATIONS

Thomas I Wallow, et al., "Evaluation of Cycloolefin–Maleic Anhydride Alternating Copolymers as Single–Layer Photoresist for 193nm Photolithography", 1996, Proc. SPIE, vol. 2724, 355–364.

R.D. Allen et. al., "The Influence of Photoacid Structure on the Design and Performance of 193nm Resists", 1997, Journal of Photopolymer Science and Technology, vol. 10, 503–510.

F.M. Houlihan et. al., "A Commercially Viable 193nm Single Layer Resist Platform", 1997, Journal of Photopolymer Science and Technology, vol. 10, 511–520.

J.C. Jung et. al., "ArF Single Layer Resist Composed of Alicyclic Main Chain Containing Maleic Anhydride", 1997, Journal of Photopolymer Science and Technology, vol. 10, 529–533.

S.J. Choi et. al., "New ArF Single–layer Resist For 193–nm Lithography", 1997, Journal of Photopolymer Science and Technology, vol. 10, 521–528.

CA Abstract 127:227308 & Proc. SPIE–Int. Soc. Opt. Eng. (1997) 3049 Advances in Resist Technology and Processing XIV 92–103.

CA Abstract 66:18889 & Magy. Kem. Foly. (1966) 72(11) 491–3.

T. Hattori et. al., "Synthesis and Dissolution Characteristics of Novel Alicyclic Polymer with Monoacid Ester Structures", 1997, Journal of Photopolymer Science and Technology, vol. 10, 535–544.

K. Nozaki and Ei Yaro, "New Protective Groups in Methacrylate Polymer for 193–nm Resists", 1997, Journal of Photopolymer Science and Technology, vol. 10, 545–550.

K. Nakano et. al., "Chemically Amplified Resist Based on High Etch–Resistant Polymer for 193–nm Lithography", 1997, Journal of Photopolymer Science and Technology, vol. 10, 561–569.

CA Register No. 100207–98–5.
CA Register No. 32759–57–2.
CA Register No. 27056–70–8.
CA Register No. 174659–58–6.
CA Register No. 28503–41–5.
CA Register No. 194997–59–6.
CA Abstract No. 104:149512 & Macromolecules 19(4) 1266–8 (1986).
CA Abstract No. 91:124064 & Makromol. Chem. 180(8) 1975–88 (1979).
CA Abstract No. 113:24734 & JP 02 051511.
CA Abstract No. 127:227269 & J Photopolym. Sci. Technol. 10(4) 529–534 (1997).
CA Abstract No. 124:317926 & Marcomol. Rapid Commun. 17(3) 173–180 (1996).
CA Abstract No. 124:203171 & Macromolecules 29(8) 2755–63 (1996).

*Primary Examiner*—John S. Chu
*Attorney, Agent, or Firm*—Townsend and Townsend and Crew LLP

[57] ABSTRACT

There is disclosed a photoresist copolymer for DUV light, with which the fine patterns allowable for the high integration of semiconductor devices can be easily obtained in a microlithography process using DUV light. The copolymer is easily prepared by reacting at least two alicyclic olefins at a high temperature and at high pressure in the presence of an initiator.

6 Claims, No Drawings

METHOD AND PHOTORESIST USING A PHOTORESIST COPOLYMER

BACKGROUND OF THE INVENTION

1. Field of the Invention

The present invention relates, in general, to the manufacture of integrated circuits. More particularly, the present invention provides a photoresist copolymer for deep ultra violet (hereinafter referred to as "DUV") light and a method for preparing the same. The photoresist copolymer, which is useful for easily forming the fine patterns allowable for the high integration of semiconductor devices by a microlithography process using DUV light.

2. Description of the Prior Art

Certainly, the recent burst into the high integration of semiconductor devices is greatly dependent on advances in microlithography. In this regard, DUV such as Krf or ArF, is developed as a light source, requiring novel photoresists. Now, chemical amplification type photoresists are prevailingly used for DUV light.

Typically, such a chemical amplification type photoresist for DUV light comprises a polymer, a solvent a photoacid generator and other additives.

In order to employ ArF as a light source, the polymer of photoresist is of eligibility for many aspects, including, for example, transparency to Arf light, etch resistance, developability in 2.38% tetramethyl ammonium hydroxide (TMAH) and adhesiveness.

It is, however, difficult to synthesize the polymer having all of such properties. For example, resins having polyacrylate as a main chain are easy to synthesize but are poor in etch resistance and development. The etch resistance can be improved by introducing alicyclic units into the main chain. A chain whose backbone consists of alicyclic units alone is very difficult to obtain.

Another example is a conventional photoresist comprises an alicyclic polymer represented by the following chemical formula I:

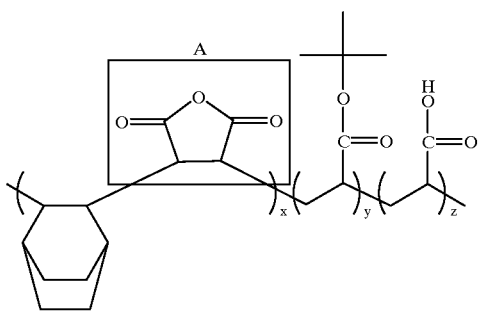

wherein, x, y and z each represents a polymerization degree ranging from 0 to 99.9. In Formula I, "A" moiety, anhydride, is used to polymerize alicyclic olefin group. This anhydride moiety, however, is very soluble to 2.38% TMAH although it is not exposed to light. The solubility problem of the anhydride can be overcome by increasing the y ratio, that is, by increasing the fraction of tertiary butyl. Correspondingly, the z ratio is reduced. Since the adhesiveness of the photoresist is often dependent on this ratio, the resulting photoresist is disadvantageously released from the wafer upon patterning.

In order to overcome drawback of Formula I, a two-component system was developed in which a cholesterol compound is used as a dissolution inhibitor at an amount of about 30% of photoresist resin. However, such a molecular structure containing dissolution inhibitor as mentioned above, is basically impossible to use in photoresist.

The aforementioned conventional techniques allow an easy polymerization of alicyclic olefins but the resulting copolymers are not stable in molecular structure so that they are not suitable for use as photoresist resins. In turn, the photoresists of the conventional techniques give the patterning process for semiconductor devices difficulty, deleteriously affecting the properties and reliability of the semiconductor devices produced. Consequently, the high integration of semiconductor devices is difficult with the above conventional techniques.

SUMMARY OF THE INVENTION

The present invention relates to a technique for overcoming the above problems encountered in prior arts and to provide a photoresist copolymer for DUV light, with which the fine patterns allowable for the high integration of semiconductor devices can be easily obtained in a microlithography process using DUV light.

In a specific embodiment, the present invention provides a method for providing a photoresist copolymer for DUV light, with which the properties and reliability of semiconductor devices can be improved.

In an alternative embodiment, the present invention provides a method for preparing a photoresist copolymer for DUV light.

In another embodiment, the present invention provides a photoresist copolymer for DUV light, which is polymerized from two alicyclic olefins or more selected from the group including 2-cyclopentene-1-acetic acid, 2-cyclopentene-1-(t-butylacetate), t-butylbicyclo [2,2,2] oct-5-ene-2-carboxylate, bicyclo [2,2,2] oct-5-ene-2-carboxylic acid, t-butyl 5-norbornene-2-carboxylate, 5-norbornene-2-carboxylic acid, cyclopentene, cyclohexene, norbornylene, and norbornylene-2-methanol.

In yet another embodiment, the present invention provides a method for preparing a photoresist copolymer for DUV light, in which at least two alicyclic olefins are polymerized at a temperature of about 50° C. or more and at a pressure of about 40 atm or more in the presence of an initiator under a noble gas atmosphere.

BRIEF DESCRIPTION OF THE DRAWINGS

Description of the Preferred Embodiment

The present invention pertains to a photoresist copolymer for DUV light, polymerized from at least two kinds of alicyclic olefins. They are reacted at a high temperature and at high pressure in the presence of an initiator under an inert atmosphere. For this, a pressure reactor may be used. In the present invention, this polymerization is carried out at about 60–200° C. and at 50–200 atm.

Examples of useful alicyclic olefins include the compounds seen in the following chemical formula II.

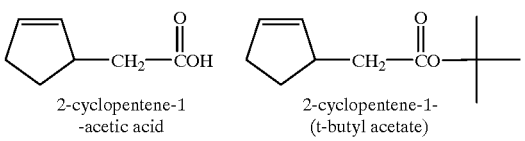

2-cyclopentene-1-acetic acid     2-cyclopentene-1-(t-butyl acetate)

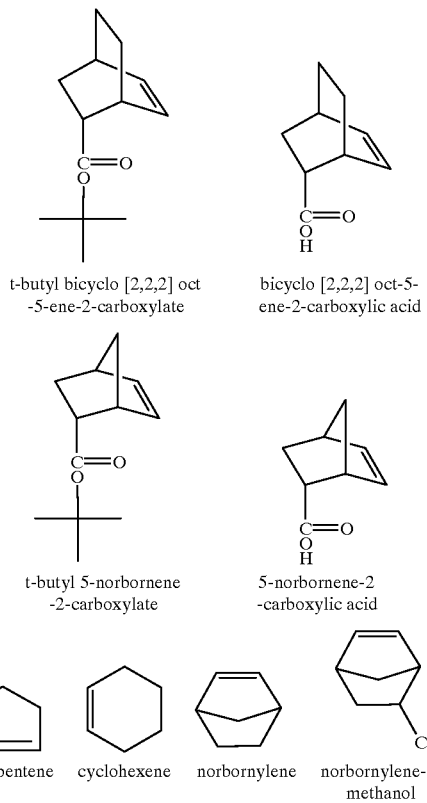

t-butyl bicyclo [2,2,2] oct
-5-ene-2-carboxylate bicyclo [2,2,2] oct-5-
ene-2-carboxylic acid t-butyl 5-norbornene
-2-carboxylate 5-norbornene-2
-carboxylic acid cyclopentene   cyclohexene   norbornylene   norbornylene-2-
methanol These alicyclic olefins are readily copolymerizable at high temperatures and at high pressures and the copolymers thus obtained show excellent adhesiveness as well as are developed in a 2.38% TMAH aqueous solution.

A better understanding of the present invention may be obtained in light of following examples which are set forth to illustrate, but are not to be construed to limit, the present invention.

EXAMPLE I

This example provides the polymerization of an alicyclic compound into a homopolymer, with the aim of illustrating the polymerization process of the present invention.

2-cyclopentene-1-acetic acid was polymerized at a temperature of about 130° C. and at a pressure of 50–100 atm in the presence of di-t-butoxy peroxide, as represented by the following reaction formula III:

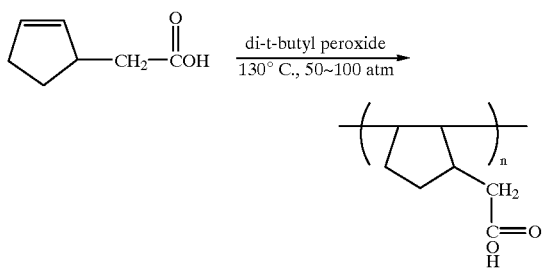

wherein n represents a polymerization degree. Generally, it is difficult to effect polymerization with only one kind of olefin. However, as seen in the reaction formula, the alicyclic olefin can be polymerized according to the present invention. In this reaction, di-t-butoxy peroxide played a role as an initiator. The product homopolymer had a molecular weight ranging from about 3,000 to 200,000. As for yield, it was 40% at 80 atm and 60% at 100 atm when the pressure in 50 atm was successively increased by 10 atm.

Likely, another alicyclic olefin selected from the group of Chemical Formula II could be polymerized.

The photoresist film made of the homopolymer of Reaction Example I is not generally useful since the absence of dissolution inhibitor in the homopolymer do not prevent unexposed regions from being dissolved upon the development using a 2.38% TMAH aqueous solution.

EXAMPLE II 2-cyclopentene-1-acetic acid and bicyclo [2.2.2] oct-5-ene-2-t-butyl carboxylate were copolymerized at 130° C. and at a pressure of 50–100 atm in the presence of di-t-butyl peroxide, as represented by the following reaction formula IV:

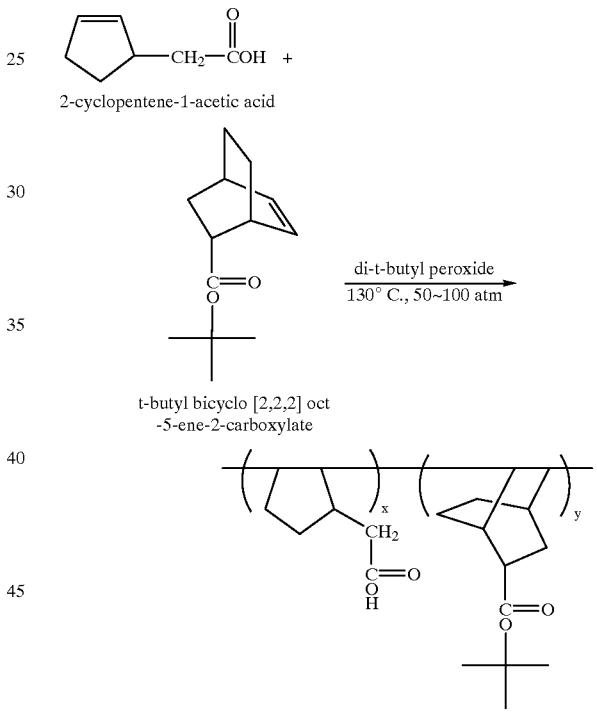

wherein x and y each represents a polymerization degree with a range from 0 to 99.9.

To this end, the reactants were charged in a pressure reactor, followed by the addition of the initiator. Instead of di-t-butoxy peroxide, other general initiators, such as t-butyl peroxide, di-t-butyl peroxide and benzoyl peroxide, may be used. Then the pressure reactor was maintained at 130° C. pressure reactor was maintained at 130° C. and pressurized to 50–100 atm, to start the polymerization. The copolymer thus obtained had a molecular weight of about 3,000 to 200,000.

Likely, other two alicyclic compounds selected from the group of Chemical Formula II could be copolymerized.

As described hereinbefore, two alicyclic compounds or more can be easily polymerized at a high temperature and at high pressure into the photoresist copolymer with which the fine patterns allowable for the high integration of semiconductor devices can be easily formed in a microlithography process using DUV light.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A copolymer suitable for use as an ArF photoresist comprising a compound represented by the following formula:

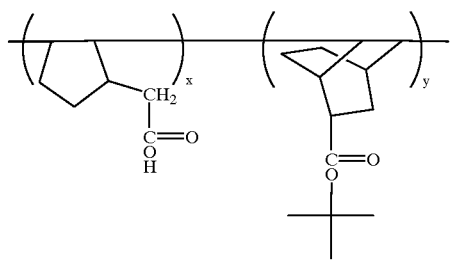

wherein X and Y each represent a polymerization degree from 0 to 99.9, provided that X and Y cannot be zero simultaneously.

2. A copolymer according to claim 1 having a molecular weight of 3,000 to 200,000.

3. A process for preparing the copolymer of claim 1 which comprises co-polymerizing 2-cyclopentene-1-acetic acid with bicyclo [2,2,2] oct-5-ene-2-t-butyl carboxylate at 130° C. and at a pressure of 50–100 atm in the presence of a peroxide initiator.

4. A process according to claim 3 wherein the peroxide initiator is di-t-butoxy peroxide, t-butyl peroxide, di-t-butyl peroxide and benzoyl peroxide.

5. A process for preparing a photoresist composition which comprises mixing the copolymer of claim 1 with a photoacid generator and an organic solvent.

6. A semiconductor device comprising a substrate which has coated thereon a film of a photoresist composition comprising the copolymer of claim 1 a photoacid generator and an organic solvent.

* * * * *

UNITED STATES PATENT AND TRADEMARK OFFICE
CERTIFICATE OF CORRECTION

PATENT NO.   : 6,143,463
DATED        : November 7, 2000
INVENTOR(S)  : Jae Chang Jung; Cheol Kyu Bok; Ki Ho Baik It is certified that error appears in the above-identified patent and that said Letters Patent is hereby corrected as shown below:

<u>Column 4,</u>
Line 60, delete "pressure reactor was maintained at 130° C.".

Signed and Sealed this

Twenty-ninth Day of January, 2002

Attest:

*Attesting Officer*

JAMES E. ROGAN
*Director of the United States Patent and Trademark Office*